United States Patent
Camenzind

[19]

[11] Patent Number: 5,880,001
[45] Date of Patent: Mar. 9, 1999

[54] METHOD FOR FORMING EPITAXIAL PINCHED RESISTOR HAVING REDUCED CONDUCTIVE CROSS SECTIONAL AREA

[75] Inventor: Hans R. Camenzind, Los Altos, Calif.

[73] Assignee: National Semiconductor Corporation, Santa Clara, Calif.

[21] Appl. No.: 956,829

[22] Filed: Oct. 23, 1997

Related U.S. Application Data

[62] Division of Ser. No. 575,853, Dec. 20, 1995, abandoned.

[51] Int. Cl.$^6$ .................................................. H01L 21/8222
[52] U.S. Cl. .......................... 438/330; 438/382; 438/414; 438/416; 438/422; 148/DIG. 136
[58] Field of Search ..................................... 438/414, 416, 438/382, 422, 330, 160, 234, 235, 236, 313, 429; 148/DIG. 136

[56] References Cited

U.S. PATENT DOCUMENTS

| | | | |
|---|---|---|---|
| 3,730,786 | 5/1973 | Ghosh | 437/918 |
| 3,761,786 | 9/1973 | Imaizumi et al. | 437/76 |
| 3,766,449 | 10/1973 | Bruchez | 317/235 R |
| 3,787,253 | 1/1974 | Ashar | 148/175 |
| 3,901,735 | 8/1975 | Dunkley | 257/556 |
| 4,463,370 | 7/1984 | Grenier | 357/50 |
| 4,686,557 | 8/1987 | Mahrla | 357/34 |
| 4,780,425 | 10/1988 | Tabata | 437/76 |
| 5,273,912 | 12/1993 | Hikada | 437/76 |

FOREIGN PATENT DOCUMENTS 55-99759 7/1980 Japan .

OTHER PUBLICATIONS

Berger et al., "Masking Process For Base and Isolation Diffusion", IBM Technical Disclosure Bulletin, p. 2531, Jan. 1972.
Grebene, Alan B., Bipolar and MOS Analog Integrated Circuit Design, John Wiley & Sons, 1984, pp. 135–167.
Grebene, Alan B., Bipolar and MOS Analog Integrated Circuit Design, John Wiley & Sons, 1984, pp. 31–38.

*Primary Examiner*—Peter Toby Brown
*Assistant Examiner*—Long Pham
*Attorney, Agent, or Firm*—Limbach & Limbach L.L.P.

[57] ABSTRACT

An epitaxial pinched resistor includes a semiconductor substrate of a first conductivity type having a surface on which an epitaxial layer of a second conductivity type grown. An up isolation region of the first conductivity type is diffused from the surface of the semiconductor substrate up into the epitaxial layer. A first down isolation region of the first conductivity type is diffused down into the epitaxial layer and overlapping with the up isolation region. The first down isolation region and the up isolation region isolate a portion of the epitaxial layer to be used to conduct a current. A second down isolation region of the first conductivity type is diffused down into the epitaxial layer between first and second contact surface areas of the epitaxial layer and into the portion of the epitaxial layer used to conduct the current. The second down isolation region is diffused a depth approximately equal to the first down isolation region so as to reduce a conductive cross-sectional area of the epitaxial layer. First and second ohmic contacts of the second conductivity type are diffused into the first and second contact surface areas of the epitaxial layer. The present invention also provides a method of forming an epitaxial pinched resistor.

12 Claims, 4 Drawing Sheets

METHOD FOR FORMING EPITAXIAL PINCHED RESISTOR HAVING REDUCED CONDUCTIVE CROSS SECTIONAL AREA

This is a divisional of application Ser. No. 08/575,853, filed Dec. 20, 1995, now abandoned.

RELATED APPLICATION

This application is related to copending application U.S. Ser. No. 08/575,931, entitled "EPITAXIAL PINCHED RESISTOR HAVING REDUCED CONDUCTIVE CROSS-SECTIONAL AREA", by Hans R. Camenzind (attorney docket no. NSC1-P6700 [NS2949]) abandoned, which was filed of even date herewith and is commonly assigned with this application to National Semiconductor Corporation of Santa Clara, Calif. The contents of this related application are hereby fully incorporated into the present application by reference.

BACKGROUND OF THE INVENTION

1. Field of the Invention

The present invention relates to epitaxial pinched resistors, and more particularly, to an epitaxial pinched resistor having a smaller conductive cross-sectional area than conventional epitaxial pinched resistors.

2. Description of the Related Art

Epitaxial pinched resistors (also known as "epi FETs" or "bulk pinched resistors") are high value resistors that are often used in bipolar, linear integrated circuits. The textbook entitled "Bipolar and MOS Analog Integrated Circuit Design", by Alan B. Grebene, provides on pages 147–50 an excellent discussion of the structure and operation of epitaxial resistors.

Referring to FIGS. 1A and 1B, an epitaxial pinched resistor 10 includes an n-type epitaxial layer 12 bordered by a p-type isolation diffusion wall 14 over a p-type substrate 28. The epitaxial layer 12 is usually made relatively thick, for example, on the order of 15 micrometers, in order to handle the high voltages applied to the device, which may fall in the range of 25–40 Volts. Ohmic contacts are made to each end of the epitaxial layer 12 with n+-type regions 16, 18, such as required for the emitter of an NPN transistor. A p-type base diffusion region 20, such as is used for the base of an NPN transistor, covers the epitaxial layer 12, except for in the end regions where the n+-type regions 16, 18 are located. The p-type base diffusion region 20 is relatively thin, for example, on the order of 2 micrometers. A layer 26 of SiO$_2$ covers the n-type epitaxial layer 12, the p-type isolation wall 14, and the p-type base diffusion region 20. Lastly, metal contacts 22, 24 are connected to the n+-type regions 16, 18.

Referring to FIG. 1C, during operation, the width of the n-type epitaxial layer 12 is reduced to the point where the depletion regions extend laterally from the p-type isolation diffusion walls 14 into the epitaxial layer 12. This reduces the conductive, or effective, cross-sectional area of the epitaxial layer 12. Additionally, the p-type base diffusion region 20 further reduces the conductive cross-sectional area and eliminates surface effects. By reducing the conductive cross-sectional area of the epitaxial layer 12, the sheet resistance of that semiconductor region is increased which forms a high-value resistor.

Because the epitaxial layer 12 is surrounded on all sides by the p-type isolation diffusion walls 14, the p-type base diffusion region 20, and the p-type substrate 28, the conductive cross-sectional area of the epitaxial layer 12 is reduced so much that the device eventually pinches off. At around the level of the pinch-off voltage, the device gradually changes from a resistance to a current source. When used as a current source, the epitaxial pinched resistor 10 has been found useful to provide small start-up currents.

As mentioned above, the epitaxial layer 12 is usually made relatively thick, e.g., 15 micrometers. This thickness provides space for the depletion region to spread. However, this thickness also dictates that the p-type isolation diffusion walls 14 be just as thick or deep. During formation of the p-type isolation diffusion walls 14, the isolation diffusion tends to spread laterally as it diffuses vertically. This results in the p-type isolation diffusion walls 14 being very wide near the surface of the chip, thus consuming a large surface area of the chip. It would be desirable to reduce the total surface area of the chip that is consumed by the epitaxial pinched resistor 10.

U.S. Pat. No. 3,901,735 to James L. Dunkley ("Dunkley") entitled "Integrated Circuit Device and Method Utilizing Ion Implanted and Up Diffusion for Isolated Region", discloses an isolation region having two parts. The contents of Dunkley is hereby fully incorporated into the present application by reference. In Dunkley, one region is implanted into the substrate before the epitaxial layer is grown which diffuses upward during subsequent heat cycles, referred to herein as "up isolation". Another region diffuses downward from the top, referred to herein as "down isolation". These two regions meet and surround the epitaxial region. Because the two regions each need to travel a vertical distance which is less than the entire thickness of the epitaxial layer, there is substantially less lateral diffusion of the isolation material than in the scenario where the isolation region needs to travel the entire thickness of the epitaxial layer. This results in an isolation region which requires less surface area of the chip than that shown in FIG. 1B.

FIGS. 2A and 2B show an epitaxial pinched resistor 30 which has been formed using the up-down isolation process described in Dunkley. A first p-type dopant is implanted into the substrate 34 before the epitaxial layer 36 is grown. After the epitaxial layer 36 is grown, a second p-type isolation diffusion region 38 is diffused into the epitaxial layer 36. During a single heat cycle, the first p-type dopant diffuses up creating the isolation diffusion region 32 and the second p-type isolation diffusion region 38 diffuses downward. The isolation regions 32, 38 overlap and isolate a portion of the epitaxial layer 36 which is used for conducting current.

Although the isolation regions 32, 38 shown in FIG. 2A consume less surface area of the chip than the isolation region 14 shown in FIG. 1B, it would nevertheless be desirable to decrease the total consumed surface area of the chip even further. Because there is a need to use epitaxial pinched resistors to provide small start-up currents, and because it is generally advantageous to conserve silicon area, there is a need for an epitaxial pinched resistor which can provide a very small current (on the order of 1 microampere) with a minimum of silicon area, i.e., less surface area than is used by the resistors 10, 30 described above.

SUMMARY OF THE INVENTION

The present invention provides an epitaxial pinched resistor. A semiconductor substrate of a first conductivity type has a surface on which an epitaxial layer of a second conductivity type is grown. An up isolation region of the first conductivity type is diffused from the surface of the semiconductor substrate up into the epitaxial layer. A first down isolation region of the first conductivity type is diffused down into the epitaxial layer and overlapping with the up isolation region. The first down isolation region and the up isolation region isolate a portion of the epitaxial layer to be used to conduct a current. A second down isolation region of the first conductivity type is diffused down into the epitaxial layer between first and second contact surface areas of the epitaxial layer and into the portion of the epitaxial layer used to conduct the current. The second down isolation region is diffused a depth approximately equal to the first down isolation region so as to reduce a conductive cross-sectional area of the epitaxial layer. First and second ohmic contacts of the second conductivity type are diffused into the first and second contact surface areas of the epitaxial layer.

The present invention also provides a method of forming an epitaxial pinched resistor. The method includes the steps of: implanting a first dopant of a first conductivity type into a surface of a semiconductor substrate of the first conductivity type in a pattern which isolates a first surface area of the semiconductor substrate used for formation of the epitaxial pinched resistor; growing an epitaxial layer of a second conductivity type over the implanted first dopant and the first surface area of the semiconductor substrate; diffusing a second dopant of the first conductivity type down into the epitaxial layer during a heat cycle to form first and second down isolation regions of substantially equal depths, the heat cycle causing the first dopant to diffuse up into the epitaxial layer to form an up isolation region which overlaps with the first down isolation region, the second down isolation region extending between first and second contact surface areas of the epitaxial layer to reduce a conductive cross-sectional area of the epitaxial layer above the first surface area of the semiconductor substrate; and diffusing a third dopant of the second conductivity type into the first and second contact surface areas of the epitaxial layer to form first and second ohmic contacts to the epitaxial layer.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 2A:
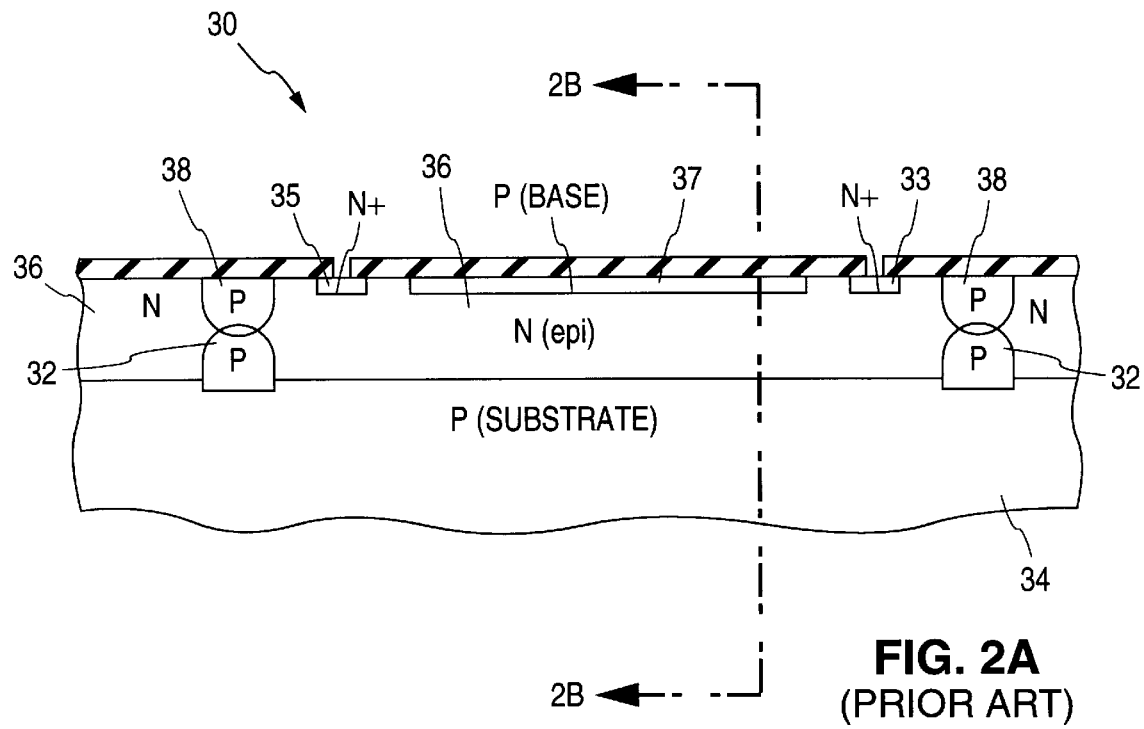
FIGS. 2A and 2B are cross-sectional views illustrating another prior art epitaxial pinched resistor.

As mentioned above, there is a need for an epitaxial pinched resistor which can provide a very small current with a minimum of silicon area. The silicon area which the epitaxial pinched resistor 30 shown in FIG. 2A requires could be further reduced if the total length of the device were decreased. In other words, decreasing the distance between the ohmic contact n+ regions 33, 35, which in turn decreases the length of the epitaxial layer 36, reduces the silicon area which is required by the resistor 30. However, simply decreasing the total length of the epitaxial pinched resistor 30 without making other modifications will degrade the performance of the device and probably prevent it from functioning. This is because the epitaxial layer 36 needs to remain the same thickness, i.e., on the order of 15 micrometers, in order to handle the high voltages which are applied to the device. Because the thickness of the epitaxial layer 36 is the same, but its length has been reduced, the depletion regions which extend from the p-type isolation regions 32, 38 and the p-type base diffusion region 37, will not be able to spread out enough so as to pinch the device off. In other words, decreasing the length of the device will increase the conductive cross-sectional area of the epitaxial layer 36. Increasing the conductive cross-sectional area of the epitaxial layer 36 prevents the device from becoming a current source.

In accordance with the present invention, the total length of an epitaxial pinched resistor is decreased in order to conserve silicon area, and at the same time, the conductive cross-sectional area of the device is also reduced so that the device functions properly. By reducing the device's conductive cross-sectional area, the depletion regions which extend from the isolation regions have less distance to spread before pinching off the device. This allows the shorter device to become pinched off and change from a resistor into a current source.

Figure 2B:
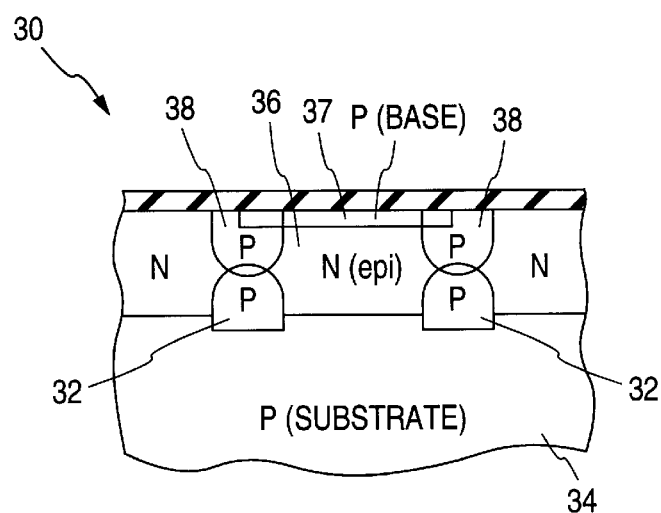

One way to decrease the conductive cross-sectional area of the epitaxial layer 36 shown in FIG. 2B is to increase the thickness of the p-type base diffusion region 37. Increasing the thickness of the p-type base diffusion region 37 will mean that the depletion region extending therefrom will have less distance to travel in order to pinch off the device. However, increasing the thickness of the p-type base diffusion region 37 creates at least one significant problem. Specifically, the p-type base diffusion region 37 is diffused into the device during a separate heat cycle than the heat cycle used to diffuse the p-type isolation regions 32, 38. In order to increase the thickness of the p-type base diffusion region 37, the time of the heat cycle used to diffuse the region 37 must be increased in order to allow the region 37 to diffuse deeper. The problem with increasing the length of that heat cycle is that the p-type isolation regions 32, 38 will also diffuse deeper and wider during the heat cycle. This will increase the surface area consumed by the p-type isolation regions 32, 38, which will significantly offset the surface area saved by decreasing the total length of the device. Thus, simply increasing the thickness of the p-type base diffusion region 37 without other modifications is not a practical way to decrease the conductive cross-sectional area of the epitaxial layer 36.

Figure 3A:
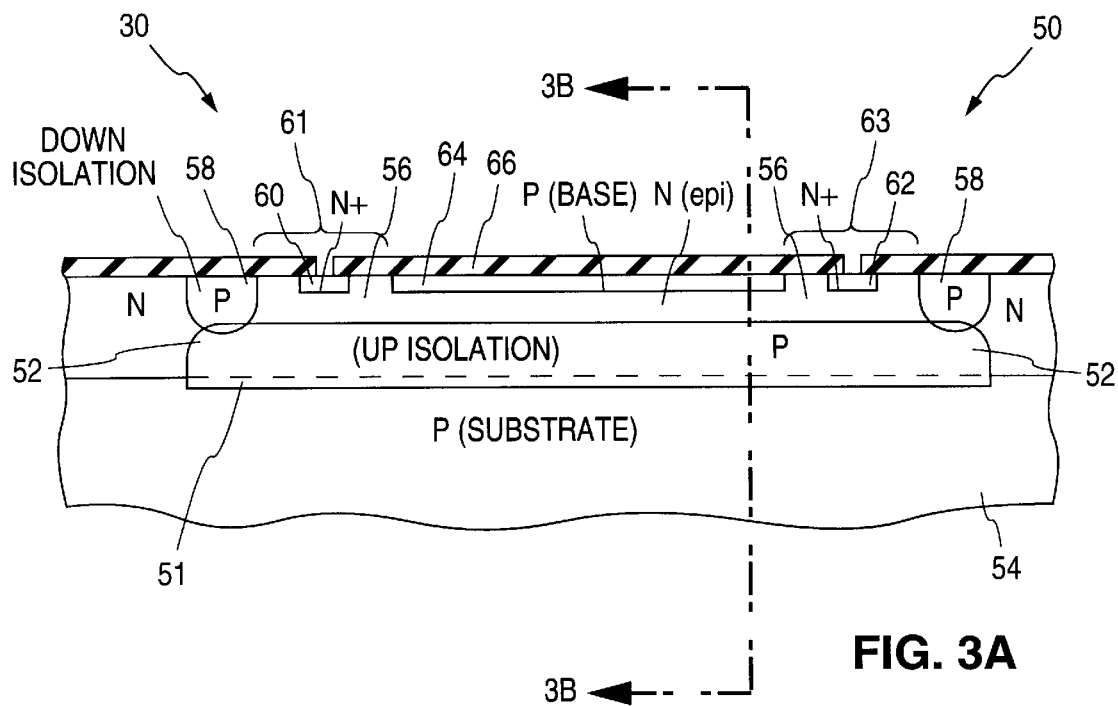
FIGS. 3A and 3B are cross-sectional views illustrating an epitaxial pinched resistor which overcomes the disadvantages of the resistors shown in FIGS. 1A–1C and 2A–2B.
Figure 3B:
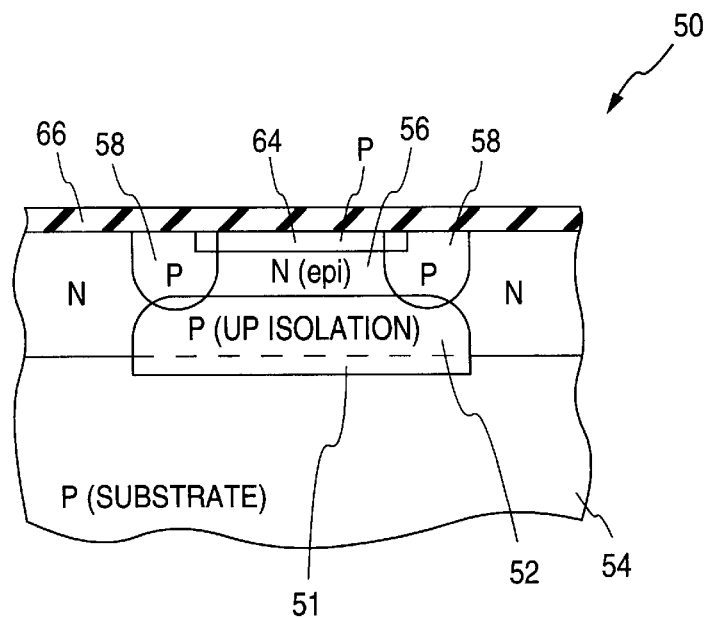

Referring to FIGS. 3A and 3B, there is illustrated an epitaxial pinched resistor 50 which overcomes the disadvantages of conventional epitaxial pinched resistors 10, 30 discussed above. The total length of the resistor 50 is shorter than the total length of the resistor 30. Furthermore, the conductive cross-sectional area of the epitaxial layer 56 has been reduced over that of the epitaxial layer 36 in the resistor 30. In general, an "up-down" isolation process, similar to that described in Dunkley, is used to reduce the conductive cross-sectional area of the epitaxial layer 56 and thus achieve a low current with a smaller silicon area.

The epitaxial pinched resistor 50 is formed by implanting a p-type dopant 51 into the substrate 54 before the epitaxial layer 56 is grown. The p-type dopant 51 may be implanted by the well known ion implantation technique. The p-type dopant 51 is spread over the entire area of the portion of the substrate 54 which is used for the resistor 50 rather than just the isolation region for the resistor 50. After the epitaxial layer 56 is grown, a p-type isolation diffusion region 58 is diffused down into the epitaxial layer 56 in the isolation region of the resistor 50, or in other words, in the same region as the isolation region 38 shown in FIG. 2A. Ohmic contacts are made to each end of the epitaxial layer 56 with n+-type regions 60, 62, diffused into first and second contact surface areas 61, 63, respectively, of the epitaxial layer 56. A p-type base diffusion region 64 covers the epitaxial layer 56, except for in the end regions where the n+-type regions 60, 62 are located. A layer 66 of $SiO_2$ covers the n-type epitaxial layer 56, the p-type isolation region 58, and the p-type base diffusion region 64.

During the diffusion heat cycle, the p-type dopant 51 diffuses up to create the up isolation region 52, and the down isolation region 58 diffuses down until the two regions 52, 58 overlap. The up and down isolation regions 52, 58 each diffuse a little over one-half the total thickness of the epitaxial layer 56. The down isolation region 58 is positioned around the perimeter of the up isolation region 52 to isolate the epitaxial layer 56. By spreading the up isolation region 52 over the entire area of the resistor 50, the remaining cross-sectional area of the epitaxial region 56 is reduced to less than one-half, as is best illustrated in FIG. 3B. Thus, the device is now being pinched off not only by the depletion regions extending laterally from the down isolation region 58, but also by the two vertical depletion regions, i.e., one extending up from the up isolation region 52, and one extending down from the p-type base diffusion region 64.

Figure 1A:
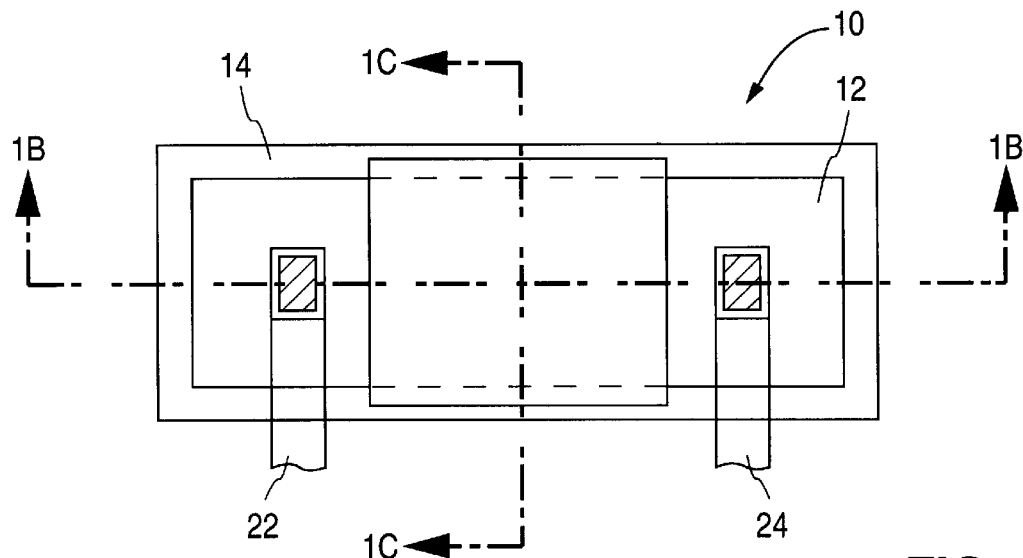
FIGS. 1A, 1B and 1C are top, cross-sectional and cross-sectional views, respectively, illustrating a prior art epitaxial pinched resistor.
Figure 1B:
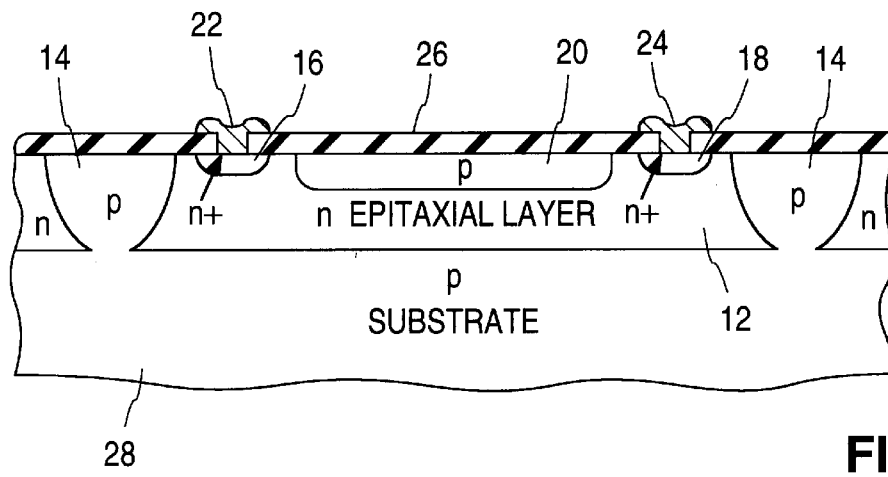
Figure 1C:
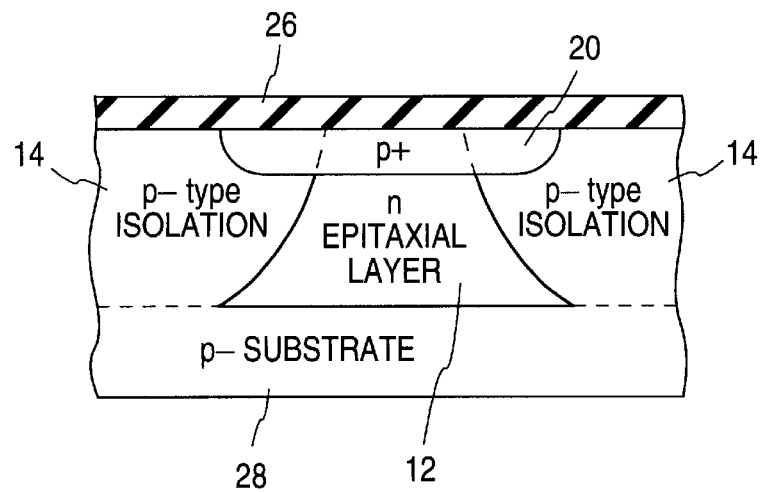

Because of the reduction in the conductive cross-sectional area of the epitaxial layer 56, the total length of the epitaxial pinched resistor 50 can be reduced to less than one-half the length of the conventional design shown in FIGS. 1A–1C for the same level of current. This conserves a significant amount of silicon area on the chip. Furthermore, the down isolation region 58 may be arranged in a rectangular shape so that the surface of the isolated portion of the epitaxial layer 56 is rectangular, such as is shown in FIG. 1A.

The up and down p-type isolation diffusion regions 52, 58 diffuse up and down during the same heat cycle, and the p-type base diffusion region 64 is diffused down during a different heat cycle.

Because the p-type base diffusion region 64 is relatively thin, i.e., on the order of 2 micrometers, the heat cycle used for its diffusion is relatively short, and therefore, does not significantly affect the up and down isolation regions 52, 58. Thus, the conductive cross-sectional area of the epitaxial layer 56 is reduced significantly without increasing the time of the heat cycle used for diffusing the p-type base diffusion region 64. This is possible because the up isolation region 52 is spread over the entire area of the resistor 50, and the up isolation region 52 is diffused during the same heat cycle that the down isolation region 58 is diffused, which minimizes silicon area consuming lateral diffusion.

Figure 4A:
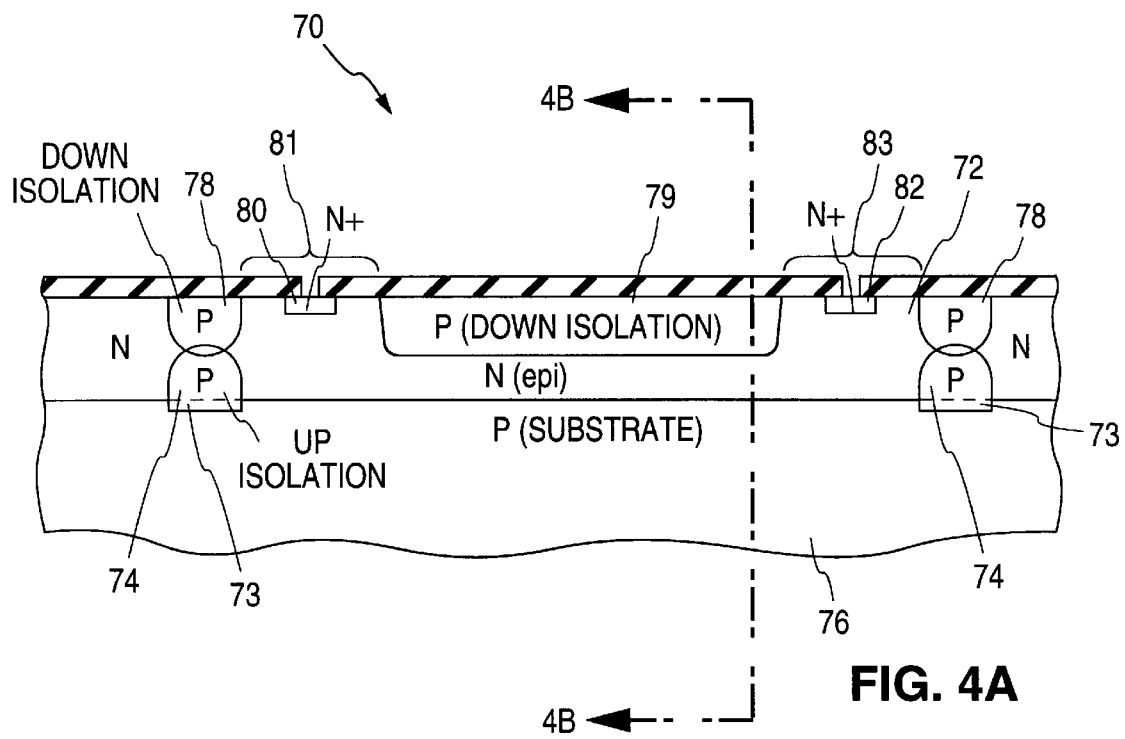
FIGS. 4A and 4B are cross-sectional views illustrating an epitaxial pinched resistor in accordance with the present invention.
Figure 4B:
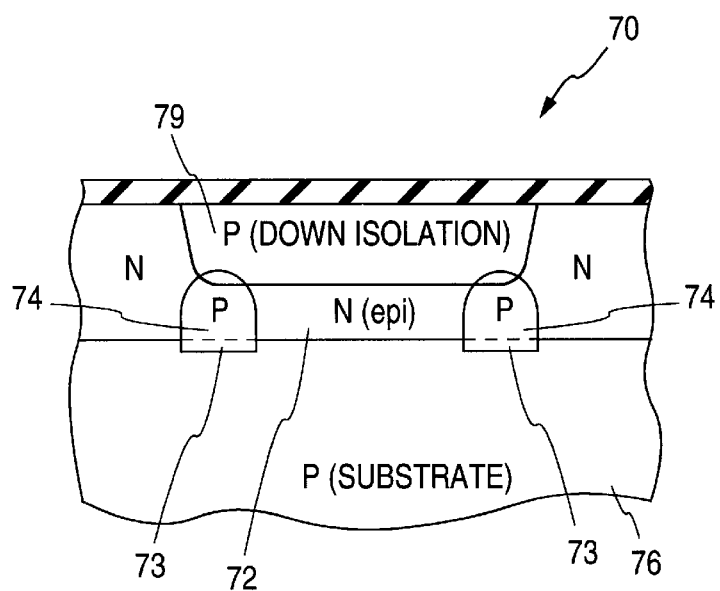

Referring to FIGS. 4A and 4B, there is illustrated an epitaxial pinched resistor 70 in accordance with the present invention. Similar to the resistor 50, the total length of the resistor 70 is shorter than the total length of the resistor 30, and the conductive cross-sectional area of the epitaxial layer 72 has been reduced over that of the epitaxial layer 36 in the resistor 30. Again, an "up-down" isolation process, similar to that described in Dunkley, is used to reduce the conductive cross-sectional area of the epitaxial layer 72 and thus achieve a low current with a smaller silicon area.

The epitaxial pinched resistor 70 is formed by implanting a p-type dopant 73 into the p-type substrate 76 before the epitaxial layer 72 is grown. Again, the p-type dopant 73 may be implanted by the well known ion implantation technique. The p-type dopant 73 is implanted in the isolation region of the resistor 70, or in other words, in the same region as the isolation region 32 shown in FIG. 2A. The p-type dopant 73 is implanted in a pattern which isolates an area of the substrate 76 which is used for formation of the epitaxial pinched resistor 70. Thus, the pattern of the p-type dopant 73 may be arranged in a rectangular shape so that the surface of the resulting epitaxial layer 72 is rectangular, such as is shown in FIG. 1A.

After the epitaxial layer 72 is grown, p-type isolation diffusion regions 78, 79 are diffused down into the epitaxial layer 72. The isolation regions 78, 79 have equal depths and are actually a single diffusion; however, the isolation regions 78, 79 are more easily described by designating them as a first down isolation region 78 and a second down isolation region 79.

The first and second down isolation regions 78, 79 are diffused down from most of the surface area of the epitaxial layer 72. Specifically, the first and second down isolation regions 78, 79 are diffused down from all of the surface area of the epitaxial layer 72 except for first and second contact surface areas 81, 83. As is shown in FIG. 4A, the first and second contact surface areas 81, 83 are for ohmic contacts which are made to each end of the epitaxial layer 72 with n+-type regions 80, 82, respectively. A layer 84 of $SiO_2$ covers the n-type epitaxial layer 72 and the first and second down isolation regions 78, 79.

During the diffusion heat cycle, the first p-type dopant 73 diffuses up to create the up isolation diffusion region 74, and the first and second down isolation regions 78, 79 diffuse down. Because the up isolation region 74 and the first and second down isolation regions 78, 79 diffuse over one-half of the depth of the epitaxial layer 72, the up isolation region 74 overlaps with the first down isolation region 78. The up isolation region 74 and the first down isolation region 78 isolate the portion of the epitaxial layer 72 which conducts current; namely, current is conducted from the n+-type region 80 to the n+-type region 82. The second down isolation region 79 is preferably centered in the epitaxial layer 72 and extends down between the first and second contact surface areas 81, 83 of the epitaxial layer 72 to reduce the conductive cross-sectional area of the epitaxial layer 72. This reduces the remaining cross-sectional area of the epitaxial region 72 to less than half, as is best illustrated in FIG. 4B. Similar to the resistor 50, the epitaxial layer 72 is now being pinched off not only by the depletion regions extending laterally from the up isolation region 74, but also by the vertical depletion region extending down from the second down isolation region 79.

Because of the reduction in the conductive cross-sectional area of the epitaxial layer 72, the total length of the epitaxial pinched resistor 70 can be reduced to less than one-half the length of the conventional design shown in FIGS. 1A–1C for the same level of current. As with the resistor 50, a significant amount of silicon area on the chip is conserved by reducing the total length of the resistor 70.

Again, similar to the resistor 50, the first and second down isolation regions 78, 79 and the up isolation region 74 all diffuse down and up, respectively, during the same heat cycle. Furthermore, the second down isolation region 79 replaces the thin p-type base diffusion region 64 shown in FIG. 3A. Thus, only one heat cycle is needed which reduces excessive lateral diffusion.

Thus, the conductive cross-sectional area of the epitaxial layer 72 is reduced by placing the second down isolation region 79 over the center portion. This results in the lower portion of the epitaxial layer 72 forming the body of the resistor.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of forming an epitaxial pinched resistor, comprising the steps of:

implanting a first dopant of a first conductivity type into a surface of a semiconductor substrate of the first conductivity type in a pattern which defines a first surface area of the semiconductor substrate for forming the epitaxial pinched resistor;

growing an epitaxial layer of a second conductivity type over the implanted first dopant and the first surface area of the semiconductor substrate;

diffusing a second dopant of the first conductivity type down into the epitaxial layer during a first heat cycle to form first and second down isolation regions, the first heat cycle diffusing the first dopant up into the epitaxial layer to form an up isolation region which overlaps with the first down isolation region, the second down isolation region extending between first and second contact surface areas of the epitaxial layer to reduce a conductive cross-sectional area of the epitaxial layer above the first surface area of the semiconductor substrate; and diffusing a third dopant of the second conductivity type into the first and second contact surface areas of the epitaxial layer to form first and second ohmic contacts to the epitaxial layer.

2. A method in accordance with claim 1, wherein the first conductivity type is P type and the second conductivity type is N type.

3. A method in accordance with claim 1, wherein the epitaxial layer has a depth and the first and second down isolation regions are diffused over one-half the depth of the epitaxial layer.

4. A method in accordance with claim 1, wherein the epitaxial layer has an upper surface area that is rectangular in shape and the second down isolation region is diffused therein in a rectangular pattern that is approximately centered in the upper surface area of the epitaxial layer.

5. A method of forming an epitaxial pinched resistor, comprising the steps of:

providing a semiconductor substrate of a first conductivity type;

implanting a first dopant of the first conductivity type into the semiconductor substrate to define a first surface area of the semiconductor substrate;

growing an epitaxial layer of a second conductivity type over the implanted first dopant and the first surface area of the semiconductor substrate;

providing a second dopant of the first conductivity type on an exposed surface of the epitaxial layer substantially above the first dopant and above a portion of the first surface area of the semiconductor substrate to isolate first and second contact surface areas on the exposed surface of the epitaxial layer; and diffusing both the first and second dopants into the epitaxial layer during a first heat cycle so that the first dopant diffuses up into the epitaxial layer to form an up isolation region and the second dopant diffuses down into the epitaxial layer to form first and second down isolation regions, the first down isolation region overlapping with the up isolation region to isolate a conducting portion of the epitaxial layer, and the second down isolation region reducing a conductive cross-sectional area of the conducting portion of the epitaxial layer between the first and second contact surface areas down to a first thickness equal to a second thickness which extends from the surface of the semiconductor substrate to the second down isolation region.

6. A method in accordance with claim 5, further comprising the step of:

diffusing a third dopant of the second conductivity type into the first and second contact surface areas of the epitaxial layer to form first and second ohmic contacts to the epitaxial layer.

7. A method in accordance with claim 5, wherein the first conductivity type is P type and the second conductivity type is N type.

8. A method in accordance with claim 5, wherein the conducting portion of the epitaxial layer has an upper surface area that is rectangular in shape and the second down isolation region is diffused therein in a rectangular pattern that is approximately centered in the upper surface area of the conducting portion of the epitaxial layer.

9. A method of forming an epitaxial pinched resistor, comprising the steps of:

providing a semiconductor substrate of a first conductivity type;

implanting a first dopant of the first conductivity type into the semiconductor substrate in an arrangement which defines a first surface area of the semiconductor substrate;

growing an epitaxial layer of a second conductivity type over the implanted first dopant and the first surface area of the semiconductor substrate;

arranging a second dopant of the first conductivity type on an exposed surface of the epitaxial layer such that a first portion of the second dopant substantially overlays the first dopant and a second portion of the second dopant overlays a center portion of the first surface area of the semiconductor substrate to isolate first and second contact surface areas on the exposed surface of the epitaxial layer; and diffusing both the first and second dopants into the epitaxial layer during a first heat cycle so that the first dopant diffuses up into the epitaxial layer to form an up isolation region, the first portion of the second dopant diffuses down into the epitaxial layer to form a first down isolation region which overlaps with the up isolation region to isolate a conducting portion of the epitaxial layer, and the second portion of the second dopant diffuses down into the epitaxial layer to form a second down isolation region which reduces a conductive cross-sectional area of the conducting portion of the epitaxial layer between the first and second contact surface areas down to a first thickness equal to a second thickness which extends from the surface of the semiconductor substrate to the second down isolation region.

10. A method in accordance with claim 9, further comprising the step of:

diffusing a third dopant of the second conductivity type into the first and second contact surface areas of the epitaxial layer to form first and second ohmic contacts to the epitaxial layer.

11. A method in accordance with claim 9, wherein the first conductivity type is P type and the second conductivity type is N type.

12. A method in accordance with claim 9, wherein the conducting portion of the epitaxial layer has an upper surface area that is rectangular in shape and the second down isolation region is diffused therein in a rectangular pattern that is approximately centered in the upper surface area of the conducting portion of the epitaxial layer.

\* \* \* \* \*